United States Patent
Yang et al.

(10) Patent No.: US 7,648,552 B2
(45) Date of Patent: Jan. 19, 2010

(54) FILLED SKUTTERUDITES FOR ADVANCED THERMOELECTRIC APPLICATIONS

(75) Inventors: Jihui Yang, Lakeshore (CA); Gregory P. Meisner, Ann Arbor, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 781 days.

(21) Appl. No.: 10/979,005

(22) Filed: Nov. 1, 2004

(65) Prior Publication Data

US 2006/0016470 A1    Jan. 26, 2006

Related U.S. Application Data

(60) Provisional application No. 60/590,878, filed on Jul. 23, 2004.

(51) Int. Cl.
*B22F 1/00* (2006.01)
*H01L 35/12* (2006.01)
*H01M 4/24* (2006.01)

(52) U.S. Cl. .............. 75/228; 136/236; 136/238; 136/239; 419/30

(58) Field of Classification Search ............... 419/30; 136/236.1, 201, 241; 75/228
See application file for complete search history.

(56) References Cited

U.S. PATENT DOCUMENTS 6,069,312 A * 5/2000 Fleurial et al. ........... 136/236.1

* cited by examiner

*Primary Examiner*—Roy King
*Assistant Examiner*—Jie Yang
(74) *Attorney, Agent, or Firm*—Reising Ethington P.C.

(57) ABSTRACT

A low-cost filled skutterudite for advanced thermoelectric applications is disclosed. The filled skutterudite uses the relatively low-cost mischmetal, either alone or in addition to rare earth elements, as a starting material for guest or filler atoms.

9 Claims, 2 Drawing Sheets ized figure of merit for state-of-the-

FILLED SKUTTERUDITES FOR ADVANCED THERMOELECTRIC APPLICATIONS

TECHNICAL FIELD

This application claims the benefit of a provisional application, Ser. No. 60/590,878, filed Jul. 23, 2004.

The present invention relates to thermoelectric devices which utilize a thermal gradient to generate electrical power and can be used in heating and cooling applications. More particularly, the present invention relates to filled skutterudites as thermoelectric materials, the fabrication of which includes use of the low-cost mischmetal alloys and mischmetal-transition metal alloys as starting materials.

BACKGROUND OF THE INVENTION

Due to an increasing awareness of global energy needs and environmental pollution in recent years, much interest has been devoted to the development and use of thermoelectric (TE) materials for automotive and other applications. TE devices are capable of transforming heat directly into electrical energy and also acting as solid state coolers. Through their energy-generating capability, TE devices are capable of enhancing the ability of internal combustion engines to convert fuel into useful power. The cooling capability of TE devices can contribute to a resolution of the greenhouse concerns associated with refrigerant use, as well as enable new design concepts for heating and air conditioning and improve the reliability of batteries. TE-based waste heat recovery is also applicable to modes of transportation such as diesel-electric locomotives, locomotive diesel engines, automotive diesel engines, diesel-electric hybrid buses, fuel cells, etc.

The energy conversion efficiency and cooling coefficient of performance (COP) of a TE device are determined by the dimensionless figure of merit, ZT, defined as $ZT = S^2 T / \rho K_{total} = S^2 T / \rho (K_L + K_e)$ where S, T, $\rho$, $K_{total}$, $K_L$, and $K_e$ are the Seebeck coefficient, absolute temperature, electrical resistivity, total thermal conductivity, lattice thermal conductivity and electronic thermal conductivity, respectively. The larger the ZT values, the higher the efficiency or the Coefficient of Performance (COP). An effective thermoelectric material should possess a large Seebeck coefficient, a low electrical resistivity and a low total thermal conductivity.

Binary skutterudites are semiconductors with small band gaps of ~100 meV, high carrier mobilities, and modest Seebeck coefficients. Binary skutterudite compounds crystallize in a body-centered-cubic structure with space group Im3 and have the form $MX_3$, where M is Co, Rh or Ir and X is P, As or Sb. Despite their excellent electronic properties, binary skutterudites have thermal conductivities that are excessively high to compete with state-of-the-art thermoelectric materials. It was found that filled skutterudites have much lower thermal conductivities. Therefore, filled skutterudites are increasingly popular as a thermoelectric material due to their lower thermal conductivities.

Filled skutterudites can be formed by inserting rare earth guest atoms interstitially into large voids in the crystal structure of binary skutterudites. The chemical composition for filled skutterudites can be expressed as $G_y M_4 X_{12}$, where G represents a guest atom, typically a rare earth atom, and y is its filling fraction. Compared to binary skutterudites, the lattice thermal conductivities of the rare earth filled skutterudites are significantly reduced over a wide temperature range. This property of filled skutterudites is due to the scattering of heat-carrying low-frequency phonons by the heavy rare earth atoms, which rattle inside the interstitial voids in the skutterudite crystal structure.

In recent years, both n- and p-type rare earth filled skutterudites have been reported to have superior thermoelectric figure of merit (ZT) values in excess of 1 for temperatures above ~500 degrees C. For rare earth filled skutterudites, the best p-type materials are La—Fe—Co—Sb and Ce—Fe—Co—Sb skutterudites. The best p-type materials are Yb—Co—Sb and Ba—Ni—Co—Sb. FIG. 1 shows ZT values of recently-discovered filled skutterudites as compared to those of state-of-the-art thermoelectric materials.

The relatively high cost of high-purity starting materials for rare earth filled skutterudites contributes to the overall cost of the fabricated thermoelectric devices. Therefore, filled skutterudites are needed which utilize low-cost starting materials to decrease the overall cost of thermoelectric devices.

SUMMARY OF THE INVENTION

The present invention is generally directed to filled skutterudites which are low-cost and suitable for use as a thermoelectric material. According to the invention, mischmetal (Mm), in addition to a transition metal alloy or both rare earth and transition metal alloys, is used as a starting material for the fabrication of both n-type and p-type filled skutterudites. Mischmetal is an alloy of both Ce (~50 wt. %) and La (~50 wt. %). In a typical embodiment, the filled skutterudite has a composition of $Mm_y Co_4 Sb_{12}$ ($0 < y \leq 1$). Use of mischmetal as a starting material for fabrication of the skutterudite provides a low-cost alternative to high-purity rare earth starting materials which characterize conventional skutterudite fabrication processes.

BRIEF DESCRIPTION OF THE DRAWINGS

The invention will now be described, by way of example, with reference to the accompanying drawings, in which.

DETAILED DESCRIPTION OF THE PREFERRED EMBODIMENTS

Figure 1:
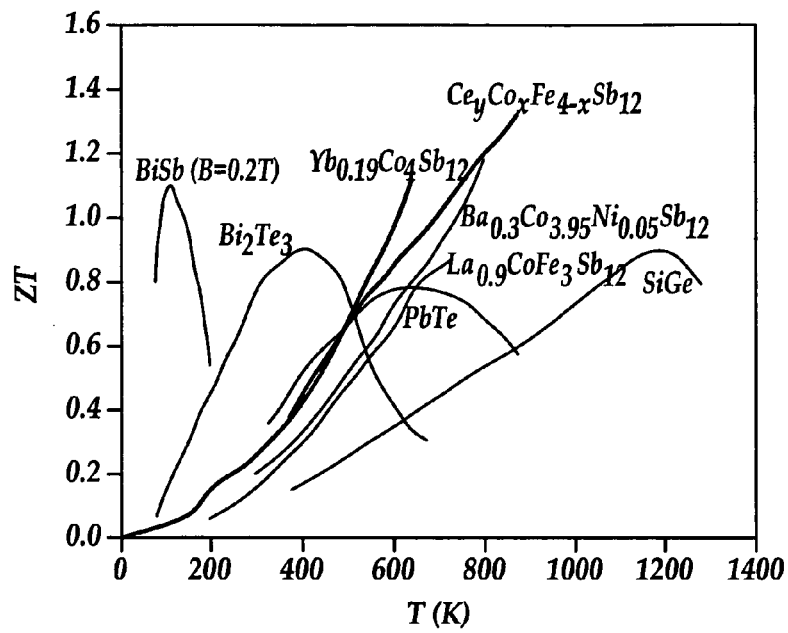
FIG. 1 is a line graph which compares the thermoelectric figure of merit (ZT) for recently-discovered filled skutterudites with the thermoelectric figure of merit for state-of-the-art thermoelectric materials.
Figure 2:
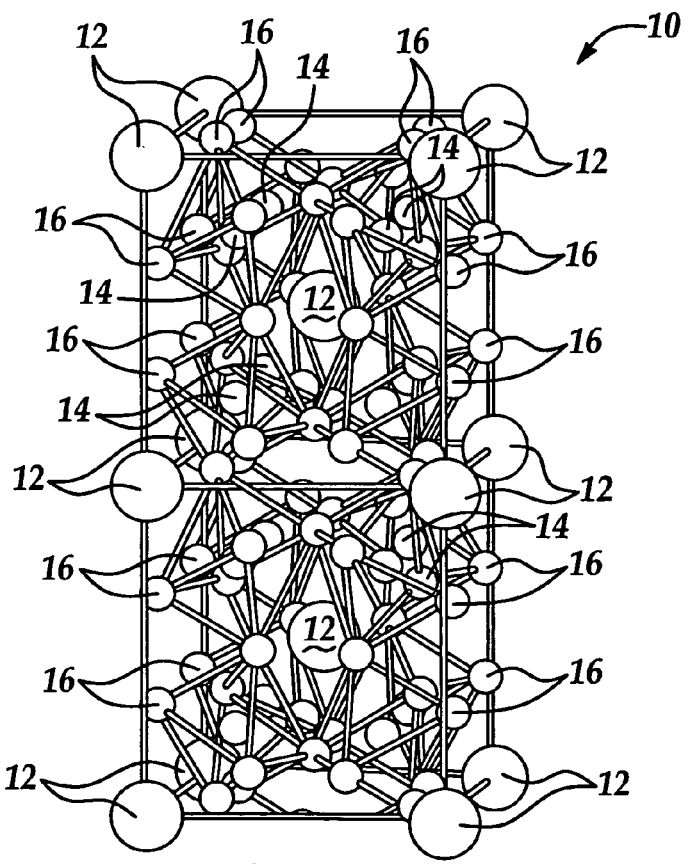
FIG. 2 illustrates a body-centered cubic crystal structure of a filled skutterudite fabricated according to the present invention.

Referring to FIG. 2, a portion of a filled skutterudite according to the present invention is generally indicated by reference numeral 10. The filled skutterudite 10 is shown in the form of a body-centered cubic crystal structure having the composition $G_y M_4 X_{12}$, where G represents guest (filling) atoms 12; y is the filling fraction of the guest atoms 12; M represents transition metal atoms 14; and X represents atoms from groups IVA-VIA of the periodic table 16. In the filled skutterudite 10, a transition metal atom 14 is enclosed in each $X_6$ tetrahedron formed by the X atoms 16. The guest atoms 12 are enclosed in the irregular dodecahedral cages formed by the adjacent tetrahedra of X atoms 16.

In the filled skutterudite 10, the X atom sites 16 may be C, Si, Ge, Sn, Pb, N, P, As, Sb, Bi, O, S, Se, Te or Po, or combinations of these atoms. Preferably, the X atoms 16 are P, As or Sb. Most preferably, the X atoms 16 are Sb.

The transition metal atoms 14 may be Mn, Tc, Re, Fe, Ru, Os, Co, Rh, Ir, Ni, Pd, Pt, Cu, Ag or Au, or combinations of these atoms. Preferably, the transition metal atoms 14 are Co, Rh or Ir. Most preferably, the transition metal atoms 14 are Co.

The guest atoms 12 in the filled skutterudite 10 maybe rare earth atoms, Na, K, Ca, Sr, Ba, and combinations of these atoms. According to the present invention, a source or starting material of the guest atoms 12 is mischmetal (Mm) alloy, which is an alloy of mostly Ce (about 50 wt.%) and La (about 50 wt.%) Mischmetal is a naturally occurring material. It is commercially available and typically comprises varying amounts of at least four rare earth elements such as lanthanum, cerium, praseodymium and neodymium, and also non-rare earth impurities such as iron, magnesium, silicon, sulfur, and phosphorus. The mischmetal may be used alone or in combination with a rare earth metal or metals as the source or starting material for the guest atoms 12. These rare-earth metals include those from the lanthanide series, such as Ce, Pr, Nd, Sm, Eu and Gd, as well as those from the actinides series, such as Th and U. In a typical embodiment, the composition of the filled skutterudite 10 is $Mm_yCo_4Sb_{12}(0<y\leq1)$.

In the filled skutterudite 10, "rattling" of the guest atoms 12 in the irregular dodecahedral cages formed by the adjacent tetrahedra of X atoms 16 reduces the lattice thermal conductivity of the material while minimally affecting carrier mobility by scattering phonons. Use of mischmetal as a source or starting material for the guest atoms 12 reduces the overall cost of the filled skutterudite 10, since mischmetal is relatively low in cost compared to high-purity rare earth elements which serve as the starting material for the filler or guest atoms in conventional filled skutterudites.

Figure 3:
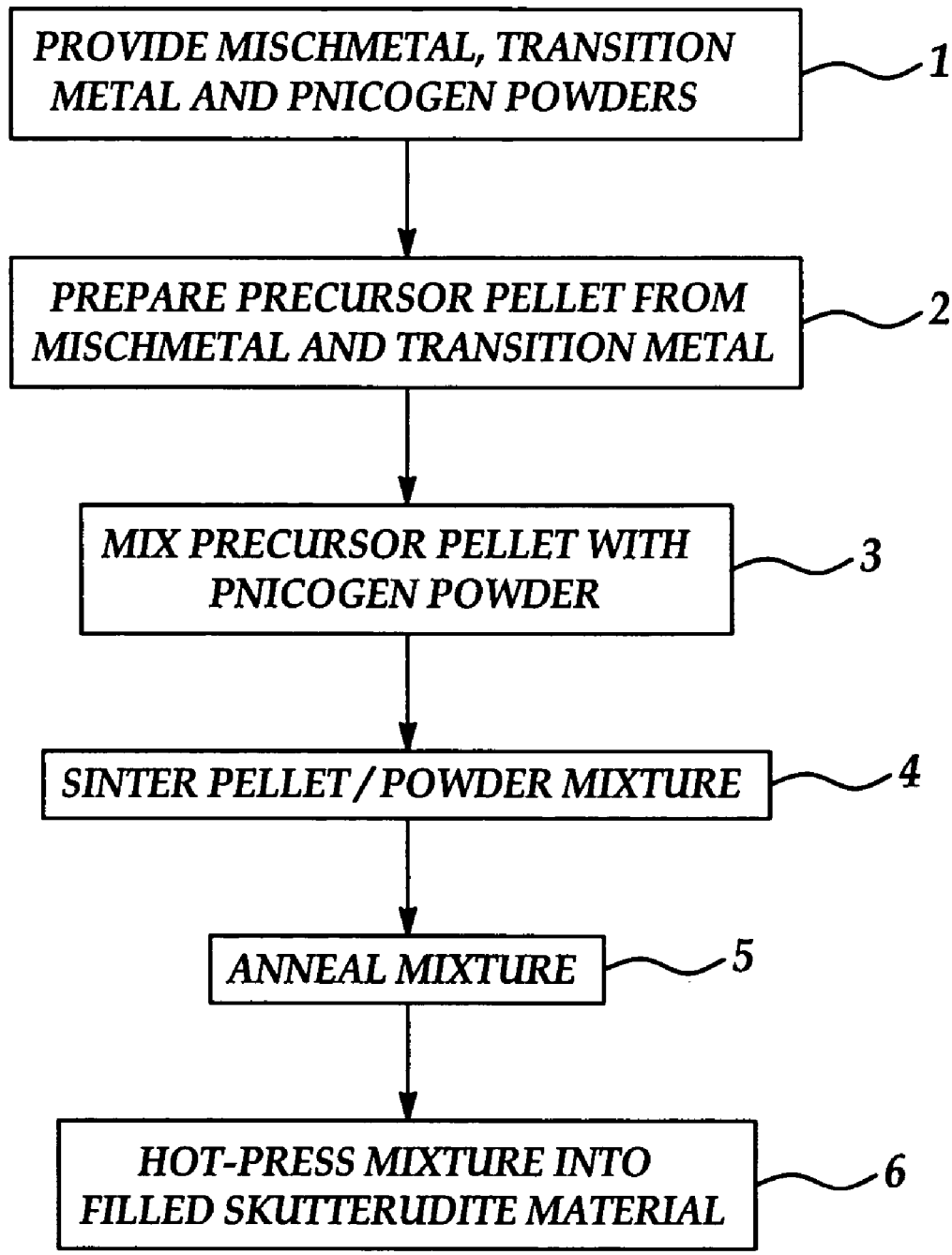
FIG. 3 is a flow diagram which illustrates sequential process steps carried out in a typical method of fabricating a filled skutterudite according to the present invention.

An illustrative method of fabricating the filled skutterudite 10 according to the present invention is shown in the flow diagram of FIG. 3. In step 1, mischmetal, transition metal and X powders are provided. These powders are available from commercial vendors. In step 2, a precursor pellet is prepared using the mischmetal and transition metal powders, or the mischmetal and other guest element powders in combination with the transition metal powder, using the proper stoichiometric ratios. This step may be carried out by using an induction furnace process or any other process which is capable of producing high temperatures (typically >1,200 degrees C.) followed by rapid cooling or quenching. In step 3, the precursor pellet formed in step 2 is mixed with the X powder. In step 4, the mixture containing the precursor pellet and X powder is sintered. This is followed by annealing of the mixture (step 5) at a temperature of typically about 500~1000 degrees C. for at least about 24 hours. Finally, the annealed mixture is hot-pressed into the filled skutterudite material at a pressure of typically at least about 57,200 psi.

While the preferred embodiments of the invention have been described above, it will be recognized and understood that various modifications can be made in the invention and the appended claims are intended to cover all such modifications which may fall within the spirit and scope of the invention.

The invention claimed is:

1. A method of fabricating a filled skutterudite for thermoelectric applications, comprising:
    providing mischmetal as a starting material for guest atoms in a filled skutterudite, wherein mischmetal comprises at least two rare earth elements and one or more non-rare earth impurities;
    providing a source of transition metal atoms (M) and a source of atoms from groups IVA-VIA of the periodic table (X), the respective M and X atoms being in proportion to form a $M_4X_{12}$ skutterudite; and
    forming said mischmetal, said source of transition metal atoms and said source of atoms from groups IVA-VIA of the periodic table into a mischmetal filled skutterudite having a chemical composition of $Mm_yM_4X_{12}$, where Mm represents guest atoms of mischmetal; y is a filling fraction of said mischmetal; M represents said transition metal atoms; and X represents said atoms from groups IVA-VIA of the periodic table.

2. The method of claim 1 wherein said chemical composition is $Mm_yCo_4Sb_{12}$ $(0<y\leq1)$.

3. The method of claim 1 wherein M is Co, Rh or Ir.

4. The method of claim 1 wherein X is P, As or Sb.

5. The method of claim 1 further comprising providing a rare earth element, in addition to said mischmetal, as a starting material for said guest atoms.

6. The method of claim 5 wherein said rare earth element is selected from the group consisting of Ce, Pr, Nd, Sm, Eu, Gd, Dy, Ho, Er, Tm, Yb, Lu, and combinations thereof.

7. The method of claim 1 further comprising:
    providing said mischmetal, said source of transition metal atoms and said source of atoms from groups IVA-VIA of the periodic table in powder form;
    forming a precursor pellet consisting essentially of said mischmetal powder and said transition metal atoms powder;
    mixing said precursor pellet with said powered source of atoms from groups IVA-VIA of the periodic table to form a mixture;
    sintering said mixture;
    annealing said mixture; and
    hot-pressing said mixture to form said filled skutterudite.

8. The method of claim 7 further comprising providing a rare earth element, in addition to said mischmetal, as a starting material for said guest atoms.

9. The method of claim 8 wherein said rare earth element is selected from the group consisting of Ce, Pr, Nd, Sm, Eu, Gd, Dy, Ho, Er, Tm, Yb, Lu, and combinations thereof.

* * * * *